US011103969B2

(12) United States Patent
Nitta

(10) Patent No.: US 11,103,969 B2
(45) Date of Patent: Aug. 31, 2021

(54) CUTTING APPARATUS

(71) Applicant: DISCO CORPORATION, Tokyo (JP)

(72) Inventor: Shuji Nitta, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 351 days.

(21) Appl. No.: 16/206,431

(22) Filed: Nov. 30, 2018

(65) Prior Publication Data
US 2019/0176290 A1 Jun. 13, 2019

(30) Foreign Application Priority Data

Dec. 8, 2017 (JP) .............................. JP2017-236307

(51) Int. Cl.
*B24B 27/06* (2006.01)
*H01L 21/67* (2006.01)
(Continued)

(52) U.S. Cl.
CPC ...... *B24B 27/0691* (2013.01); *B24B 27/0076* (2013.01); *B24B 27/0608* (2013.01);
(Continued)

(58) Field of Classification Search
CPC ............ B24B 27/0691; B24B 27/0076; B24B 27/0608; B24B 27/0069; B24B 27/0023; B24B 27/06; B24B 41/005; B24B 41/068; B24B 41/02; B24B 41/053; B24B 49/12; B24B 49/00; B24B 55/02; B24B 55/04; B24B 45/006; B24D 5/12; B24D 5/16; H01L 21/67092; B28D 5/022; B28D 5/0058; B28D 5/0082; B28D 5/0005;
(Continued)

(56) References Cited

U.S. PATENT DOCUMENTS 6,606,985 B2 * 8/2003 Negishi ..................... B27B 5/32
125/13.01
2002/0168929 A1 * 11/2002 Fujioka .............. B24D 18/0018
451/547
(Continued)

FOREIGN PATENT DOCUMENTS

CN 109909554 A * 6/2019
JP 2000190155 A 7/2000
(Continued)

*Primary Examiner* — Joseph J Hail
*Assistant Examiner* — Michael A Gump
(74) *Attorney, Agent, or Firm* — Greer Burns & Crain, Ltd.

(57) ABSTRACT

A cutting apparatus includes: a processing feeding unit that performs processing feeding of a chuck table adapted to hold a workpiece; and two cutting units in which rotational axes of two spindles coincide with each other and cutting blades mounted to the spindles face each other. Each cutting unit includes a flange mechanism in which the cutting blade having a cutting edge fixed to an outer peripheral edge of a one-side outer surface of a circular disk-shaped base is fixed to the spindle. The flange mechanism is fixed to a tip of the spindle, sucks an other-side outer surface of the base of the cutting blade, and fixes the cutting blade to the spindle with the one-side outer surface of the base exposed to the side of the tip of the spindle, and the one-side outer surfaces of the cutting blades fixed to the two cutting units.

4 Claims, 7 Drawing Sheets

(51) Int. Cl.
  *B24B 41/00* (2006.01)
  *B24B 27/00* (2006.01)
  *B24B 41/06* (2012.01)
  *B24D 5/16* (2006.01)
  *B24D 5/12* (2006.01)
  *B24B 55/04* (2006.01)
  *B24B 41/02* (2006.01)
  *B24B 41/053* (2006.01)
  *B24B 49/12* (2006.01)
  *B24B 55/02* (2006.01)

(52) U.S. Cl.
  CPC .......... *B24B 41/005* (2013.01); *B24B 41/068* (2013.01); *B24D 5/12* (2013.01); *B24D 5/16* (2013.01); *H01L 21/67092* (2013.01); *B24B 27/0069* (2013.01); *B24B 41/02* (2013.01); *B24B 41/053* (2013.01); *B24B 49/12* (2013.01); *B24B 55/02* (2013.01); *B24B 55/04* (2013.01)

(58) Field of Classification Search
  CPC .. B27B 5/30; B27B 5/32; B27B 5/325; B26D 7/2621
  USPC ................ 451/11, 190, 194, 262; 125/23.01; 83/666
  See application file for complete search history.

(56) References Cited

U.S. PATENT DOCUMENTS

| | | | |
|---|---|---|---|
| 2015/0020670 A1* | 1/2015 | Wakita | H01L 21/304 83/522.12 |
| 2016/0207216 A1* | 7/2016 | Nitta | B23B 31/307 |
| 2016/0284611 A1* | 9/2016 | Sekiya | B28D 5/0064 |
| 2019/0084124 A1* | 3/2019 | Sekiya | B23D 59/025 |

FOREIGN PATENT DOCUMENTS

| | | | | |
|---|---|---|---|---|
| JP | 2002154054 A | * | 5/2002 | |
| JP | 2002154054 A | | 5/2002 | |
| WO | WO-03011546 A1 | * | 2/2003 | ........... B23D 61/025 |

\* cited by examiner

CUTTING APPARATUS

BACKGROUND OF THE INVENTION

Field of the Invention

The present invention relates to a cutting apparatus.

Description of the Related Art

There is known a cutting apparatus for precisely cutting a semiconductor package, a package substrate, a ceramic substrate, a glass substrate and the like by a cutting blade. In the cutting apparatus, the cutting blade is supported by a flange mechanism and fixed to a spindle. As the cutting blade, a cutting blade of the type which is called a hub blade and in which a cutting edge is attached to an outer periphery of an annular base is widely used because of its good workability (damaged to the cutting edge can be prevented due to the presence of a handle). The cutting blade of the type called the hub blade is mounted to a cutting apparatus with its base fixed to the spindle by a flange mechanism (see, for example, Japanese Patent Laid-open No. 2000-190155).

In the flange mechanism of the cutting apparatus disclosed in Japanese Patent Laid-open No. 2000-190155, an annular base is fitted over a boss section of a mount flange mounted to the spindle, and a presser nut is screw engaged with the boss section, to fix the cutting blade. Further, there has been devised a flange mechanism in which the flange mechanism having the cutting blade received by the presser nut and fixed to the flange side is improved, and in which fixation by vacuum is possible instead of fixation by the presser nut (see, for example, Japanese Patent Laid-open No. 2002-154054). In the flange mechanism disclosed in Japanese Patent Laid-open No. 2002-154054, it is unnecessary to tighten or loosen the presser nut at the time of blade replacement, and the cutting blade can be replaced extremely easily.

SUMMARY OF THE INVENTION

As a cutting apparatus, a cutting apparatus in which two spindles are disposed to face each other, for efficient cutting, has been widespread. In this kind of cutting apparatus, cutting is efficient because two division lines (streets) can be cut at a time. In the cutting apparatus including the two spindles, a reduction in the distance between cutting blades is desired, for further enhancing the operating efficiency. In addition, in the aforementioned cutting apparatus, if the division lines of equivalent lengths can always be cut by the two spindles, the processing feeding amount is minimized and efficient processing is accomplished. For this purpose, it is necessary for the distance between the cutting blade to be freely settable. Thus, an apparatus configuration in which the distance between the cutting blades can be reduced to the utmost limit is desired, for eliminating limitations as to the distance.

In the conventional cutting apparatus in which two spindles are disposed to face each other, however, a hub of the annular base is grasped and the hub blade is mounted to the spindle in the case of mounting the hub blade to the spindle, and, therefore, a cutting edge is secured to an outer peripheral edge of an opposite surface of the annular base formed with the hub. For this reason, in the cutting apparatus in which two spindles are disposed to face each other, the hub sections of the annular bases face each other, and, accordingly, the spacing between the cutting edges secured to the cutting blades cannot be reduced to the utmost limit.

It is therefore an object of the present invention to provide a cutting apparatus in which the distance between cutting blades mounted respectively to two spindles can be reduced.

In accordance with an aspect of the present invention, there is provided a cutting apparatus including: a chuck table adapted to hold a workpiece; a processing feeding unit adapted to perform processing feeding of the chuck table in an X direction; a first cutting unit including: a first spindle having a rotational axis extending in a Y direction orthogonal to the X direction; a first spindle housing adapted to accommodate the first spindle in a rotatable manner; a first rotary joint fixed to a tip portion of the first spindle housing and having a first suction passage selectively connected to a suction source; a first flange mechanism mounted to a tip portion of the first spindle, the first flange mechanism provided with a first boss section and a first flange section projecting radially outward on a rear side of the first boss section and formed integrally with the first boss section and a first cylinder section formed integrally with the first flange section on a rear side of the first flange section, the first flange mechanism having a first annular suction groove formed at an outer periphery of the first cylinder section and communicating with the first suction passage, and a second suction passage having one end communicating with the first annular suction passage and the other end opening at a front surface of the first flange section; and a first cutting blade including an annular first base which has a mounting hole formed in a center thereof and a one-side surface and an other-side surface opposite to the one-side surface, and a first cutting edge secured to an outer peripheral edge of the one-side surface of the annular first base, the first cutting blade mounted to the first flange mechanism by fitting the first mounting hole to the first boss section of the first flange mechanism; and a second cutting unit including: a second spindle having a rotational axis extending in the Y direction orthogonal to the X direction; a second spindle housing adapted to accommodate the second spindle in a rotatable manner; a second rotary joint fixed to a tip portion of the second spindle and having a third suction passage selectively connected to the suction source; a second flange mechanism mounted to a tip portion of the second spindle, the second flange mechanism provided with a second boss section and a second flange section projecting radially outward on a rear side of the second boss section and formed integrally with the second boss section and a second cylinder section formed integrally with the second flange portion on a rear side of the second flange portion, the second flange mechanism having a second annular suction groove formed at an outer periphery of the second cylinder section and communicating with the third suction passage of the second rotary joint, and a fourth suction passage having one end communicating with the second annular suction groove and the other end opening at a front surface of the second flange section; and a second cutting blade including an annular second base having a second mounting hole formed in a center thereof and a one-side surface and an other-side surface opposite to the one-side surface, and a second cutting edge secured to an outer peripheral edge of the one-side surface of the annular second base, the second cutting blade mounted to the second flange mechanism by fitting the second mounting hole to the second boss section of the second flange mechanism, in which the first and second cutting blades have their other-side surface sides put into contact with and held with suction on the first and second flange sections of the first and second flange mechanisms by introduction of a negative pressure into the first and second flange mechanisms through the first and second rotary joints, and the first cutting blade mounted to the first spindle and the second cutting blade mounted to the second spindle are in a state in which the first cutting edge secured to the one-side surface of the annular first base and the second cutting edge secured to the one-side surface of the annular second base face each other.

Preferably, the first boss section of the first flange mechanism has such a size as not to protrude from the annular first base of the first cutting blade mounted to the first flange mechanism, and the second boss section of the second flange mechanism has such a size as not to protrude from the annular second base of the second blade mounted to the second flange mechanism.

According to the cutting apparatus of the present invention, a structure in which the cutting blade is held with suction by a negative pressure is adopted, in place of a mechanism in which a cutting blade is fixed by a conventional fixing nut. In addition, a structure in which other-side surface sides of the annular bases where the cutting edges are not secured are sucked and held with suction onto the flange mechanisms and in which the cutting edges secured to one-side surface sides of the annular bases face each other is adopted. Therefore, the distance between the cutting edges of the cutting blades of the two cutting units can be reduced to the utmost limit.

The above and other objects, features and advantages of the present invention and the manner of realizing them will become more apparent, and the invention itself will best be understood from a study of the following description and appended claim with reference to the attached drawings showing some preferred embodiment of the invention.

DETAILED DESCRIPTION OF THE PREFERRED EMBODIMENT

Figure 1:
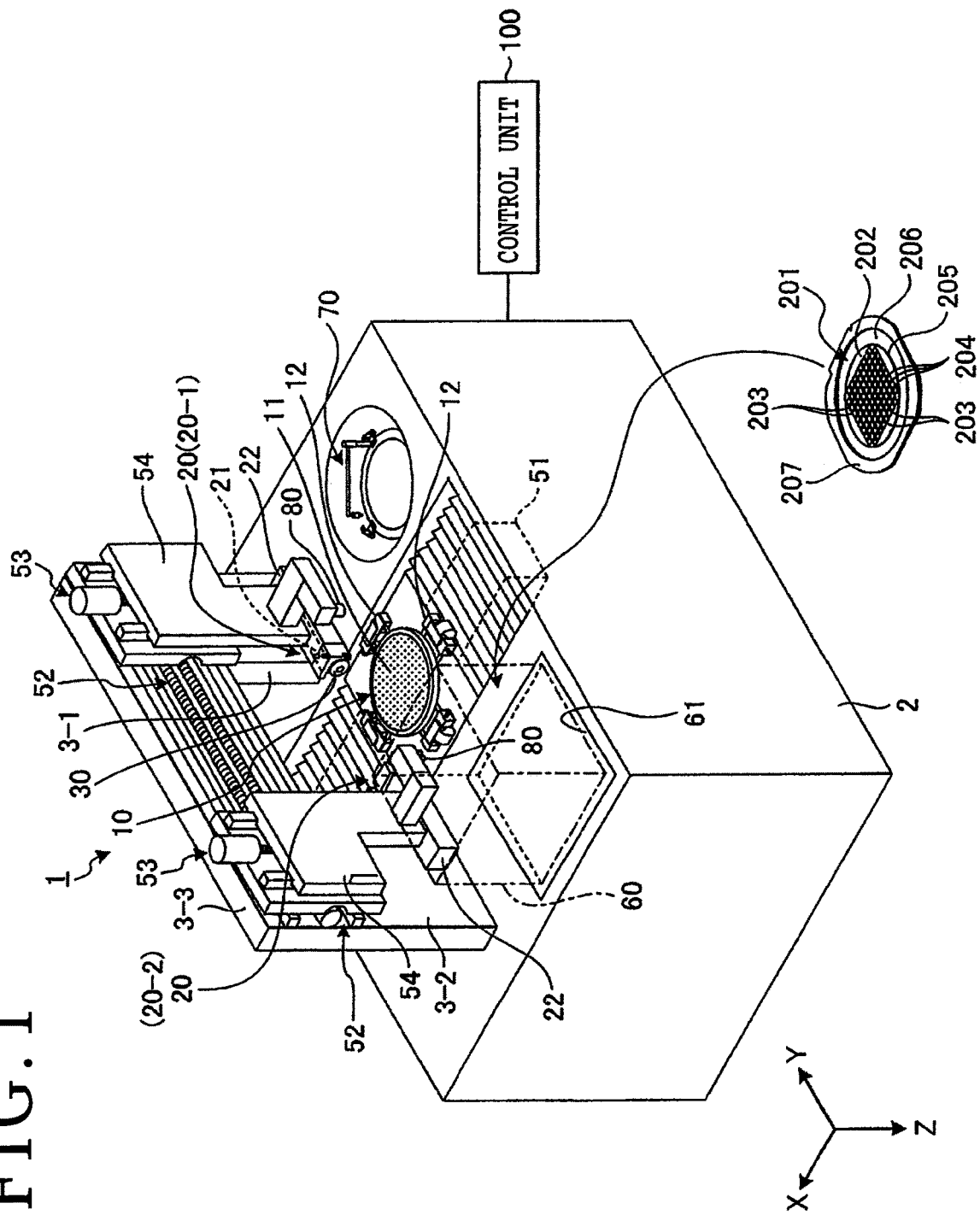
FIG. 1 is a perspective view depicting a configuration example of a cutting apparatus according to an embodiment of the present invention.

A mode (embodiment) for carrying out the present invention will be described in detail below, referring to the drawings. The present invention is not to be limited by the contents of the description of the following embodiment. In addition, the components described below include those easily conceivable by persons skilled in the art and those which are substantially the same as the ones described below. Further, the configurations described below may be combined with one another, as required. Besides, various omissions, replacements and modifications in the configuration are possible without departing from the gist of the present invention.

Figure 2:
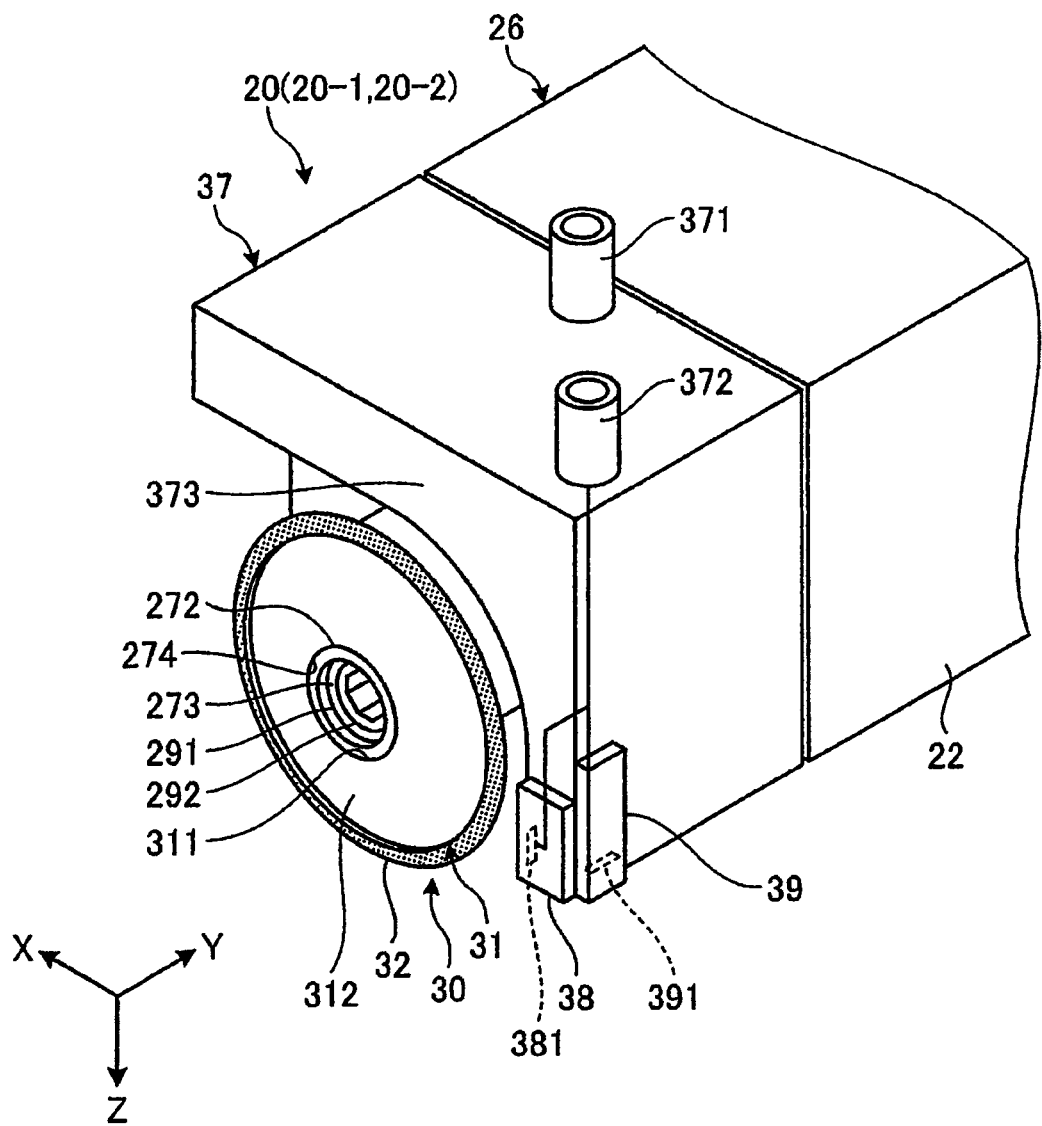
FIG. 2 is a perspective view depicting a major part of a cutting unit of the cutting apparatus according to the present embodiment.
Figure 3:
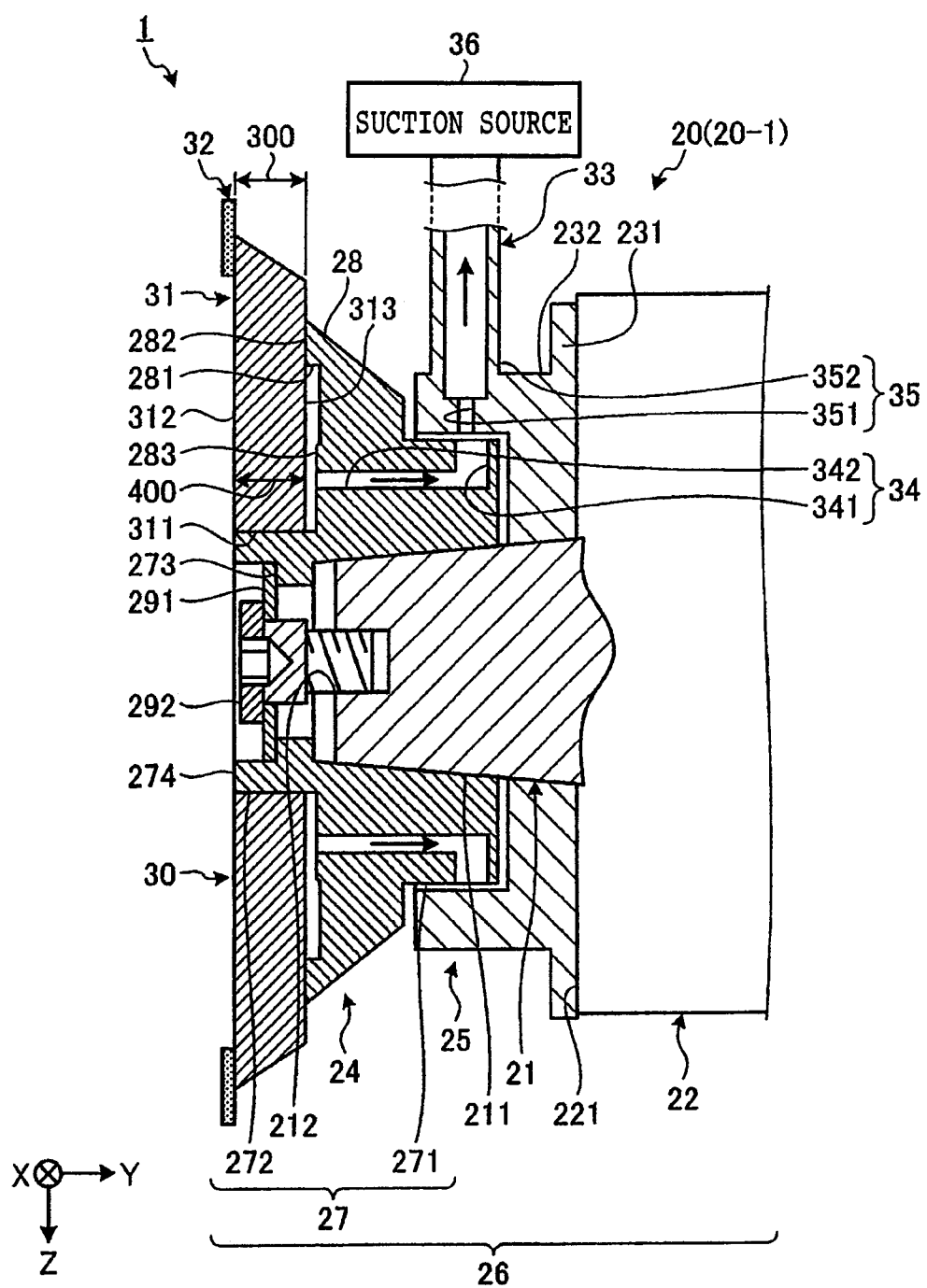
FIG. 3 is a sectional view of the major part of the cutting unit of the cutting apparatus according to the present embodiment.
Figure 4:
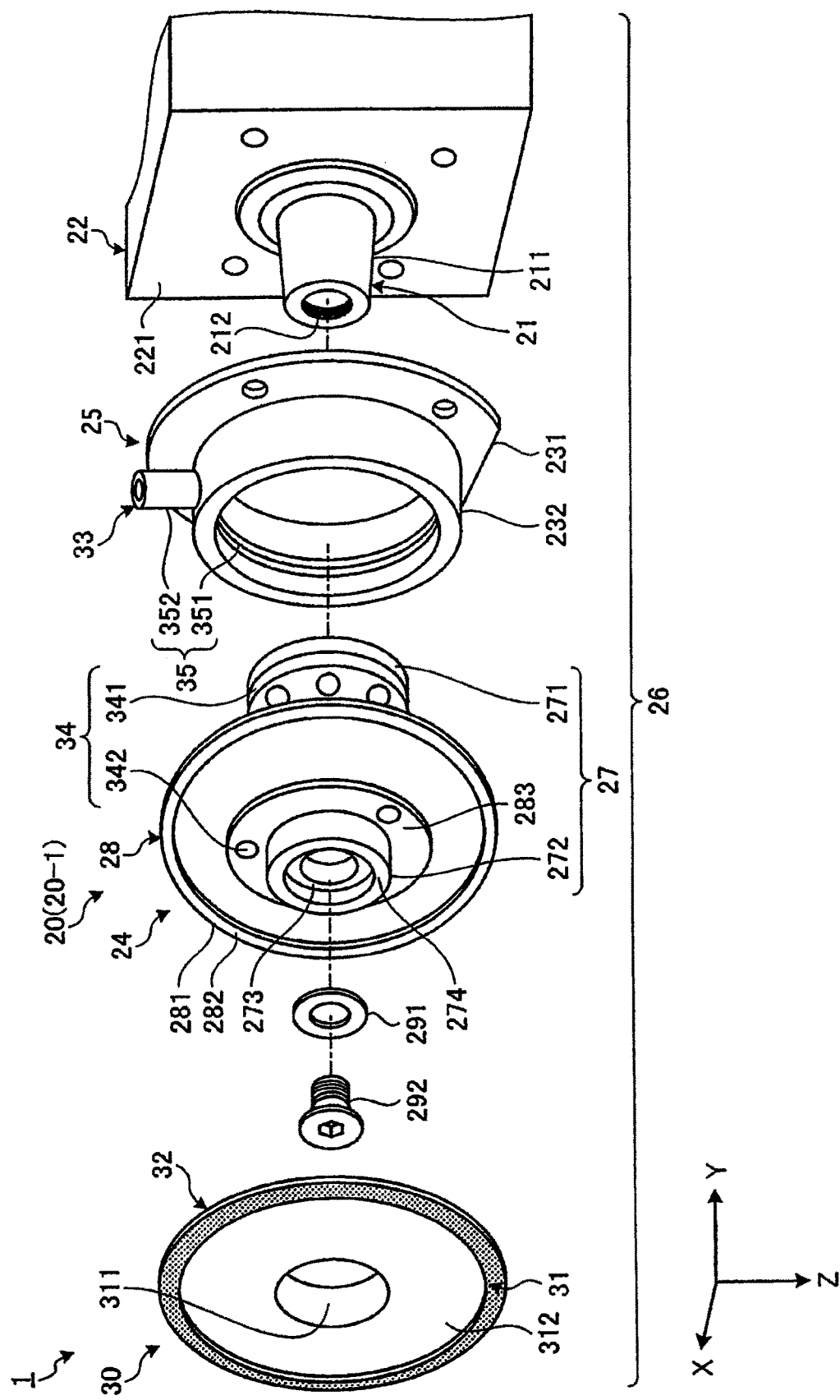
FIG. 4 is an exploded perspective view of the major part of the cutting unit of the cutting apparatus according to the present embodiment.

A cutting apparatus according to the present embodiment will be described based on the drawings. FIG. 1 is a perspective view depicting a configuration example of the cutting apparatus according to the present embodiment. FIG. 2 is a perspective view depicting a major part of a cutting unit of the cutting apparatus according to the present embodiment. FIG. 3 is a sectional view of the major part of the cutting unit of the cutting apparatus according to the present embodiment. FIG. 4 is an exploded perspective view of the major part of the cutting unit of the cutting apparatus according to the present embodiment.

The cutting apparatus 1 according to the present embodiment is an apparatus for cutting a workpiece 201. In the present embodiment, the workpiece 201 is a circular disk-shaped semiconductor wafer or optical device wafer formed from silicon, sapphire, gallium or the like as base material. The workpiece 201 has devices 204 formed in regions partitioned by a plurality of division lines (streets) 203 formed in a grid pattern on a front surface 202 thereof. The workpiece 201 in the present invention may be a so-called TAIKO wafer which has a central portion thinned and which is formed with a thicker part at a peripheral portion thereof; other than the wafer, the workpiece 201 may be a rectangular package substrate, ceramic substrate, glass substrate or the like having a plurality of devices sealed with a resin. The workpiece 201 is united with an annular frame 207 by adhering an adhesive tape 206 as a protective member to a back surface 205 thereof and adhering the annular frame 207 to a peripheral portion of the adhesive tape 206.

As illustrated in FIG. 1, the cutting apparatus 1 includes: a chuck table 10 provided with a holding surface 11 adapted to hold the workpiece 201 by suction; a cutting unit 20 adapted to cut the workpiece 201 held on the chuck table 10 by a cutting blade 30 mounted to a spindle 21; and a control unit 100.

In addition, the cutting apparatus 1 includes: a processing feeding unit 51 adapted to perform processing feeding of the chuck table 10 in a X direction, which is a processing feeding direction parallel to the holding surface 11; an indexing feeding unit 52 adapted to perform indexing feeding of the cutting unit 20 in a Y direction, which is an indexing direction parallel to the holding surface 11 and orthogonal to the X direction; and a cutting-in feeding unit 53 adapted to perform cutting-in feeding of the cutting unit 20 in a Z direction which is orthogonal to the X direction and the Y direction and is parallel to the vertical direction. Besides, the cutting apparatus 1 includes: a cassette elevator 61 on which a cassette 60 for accommodating the workpieces 201 before and after cutting is placed and which moves the cassette 60 in the Z direction; a cleaning unit 70 adapted to clean the workpiece 201 after cutting; and a carrying unit (not depicted) adapted to carry the workpiece 201 into and out of the cassette 60 and to carry the workpiece 201.

Note that as depicted in FIG. 1, the cutting apparatus 1 is a two-spindle dicing saw, namely, a so-called facing dual type cutting apparatus which includes two cutting units 20 and in which the cutting blades 30 mounted to the spindles 21 are disposed at such positions as to face each other. In addition, rotational axes of the spindles 21 of the two cutting units 20 are set in the Y direction and are coincident with each other.

The chuck table 10 is disk-shaped, and its holding surface 11 for holding the workpiece 201 is formed from a porous ceramic or the like. In addition, the chuck table 10 is provided to be movable by the processing feeding unit 51 and to be rotatable by a rotational drive source (not depicted) around an axis parallel to the Z direction. The chuck table 10 is connected to a vacuum suction source (not depicted), and, when suction is applied by the vacuum suction source, the chuck table 10 holds the workpiece 201 to be cut by the cutting blade 30 of the cutting unit 20, with suction. Besides, in the periphery of the chuck table 10, there are provided a plurality of clamp sections 12 driven by air actuators (not depicted) to clamp the annular frame 207 disposed in the periphery of the workpiece 201.

Each cutting unit 20 is provided to be movable in the Y direction by the indexing feeding unit 52 and movable in the Z direction by the cutting-in feeding direction 53, in relation to the workpiece 201 held by the chuck table 10. The cutting unit 20 on one side (this cutting unit will hereinafter be denoted by reference symbols 20-1) is a first cutting unit, which is provided on a column section 3-1 on one side erected from an apparatus main body 2 through the indexing feeding unit 52, the cutting-in feeding unit 53 and the like, as depicted in FIG. 1. The cutting unit 20 on the other side (this cutting unit will hereinafter be denoted by reference symbol 20-2) is a second cutting unit, which is provided on a column section 3-2 on the other side erected from the apparatus main body 2 through the indexing feeding unit 52, the cutting-in feeding unit 53 and the like. Note that the column sections 3-1 and 3-2 have their upper ends connected by a horizontal beam 3-3. Note that herein the two cutting units 20 are denoted by reference symbols 20-1 and 20-2 when they are to be distinguished from each other, and are denoted by reference symbol 20 when they are not to be distinguished from each other.

The cutting unit 20 has a configuration in which the cutting blade 30 can be positioned at an arbitrary position of the holding surface 11 of the chuck table 10 by the indexing feeding unit 52 and the cutting-in feeding unit 53. As depicted in FIG. 2, the cutting unit 20 includes a spindle unit 26 and a blade cover 37. As depicted in FIGS. 3 and 4, the spindle unit 26 includes a spindle 21, a spindle housing 22, a rotary joint 25, the cutting blade 30, and a flange mechanism 24.

The spindle 21 is rotated around a rotational axis parallel to the Y direction by a spindle motor (not depicted). As illustrated in FIG. 3, a tip portion of the spindle 21 is provided with a tapered section 211 gradually reduced in diameter in going toward a tip, and a screw hole 212 is opened in a tip surface of the tapered section 211. The spindle housing 22 is formed in a tubular shape, is provided to be movable in the Y direction by the indexing feeding unit 52, and to be movable in the Z direction by the cutting-in feeding direction 53. The spindle housing 22 accommodates the spindle 21 in a state in which the tapered section 211 is exposed. The spindle housing 22 supports the spindle 21 such that the spindle 21 is rotatable around a rotational axis.

The rotary joint 25 is a member on the spindle housing 22 side. Note that the member on the spindle housing 22 side means the spindle housing 22 itself or a member attached to the spindle housing 22. In the present embodiment, the rotary joint 25 is attached to a tip surface 221 of the spindle housing 22 by screws (not depicted) or the like. The rotary joint 25 includes an annular attachment section 231 and a tubular support tube section 232.

While the attachment section 231 is formed in a circular annular shape in the present embodiment, in the present invention the planar shapes of inner and outer edges of the attachment section may be polygonal. The support tube section 232 is continuous with the inner edge of the attachment section 231. While the support tube section 232 is formed in a cylindrical shape in the present embodiment, in the present invention the support tube section may be formed in a polygonal tubular shape. The inside diameters of the attachment section 231 and the support tube section 232 are sufficiently greater than the outside diameter of the tapered section 211 of the spindle 21. The tapered section 211 of the spindle 21 is passed through the inside of the attachment section 231 and the support tube section 232 of the rotary joint 25, and the attachment section 231 is laid on the tip surface 221 of the spindle housing 22. Of the rotary joint 25, the attachment section 231 is fixed to the spindle housing 22 by screws (not depicted).

The cutting blade 30 is fixed to the tapered section 211 of the spindle 21 through the flange mechanism 24, and, by being rotated by the spindle 21, cuts the workpiece 201. The cutting blade 30 is a so-called hub blade which includes a circular annular (disk-shaped) base 31 formed from a metal and formed with a mounting hole 311 in the center thereof, and a circular annular cutting edge 32 fixed to an outer peripheral edge of the base 31 and disposed coaxially with the base 31. The mounting hole 311 is a hole for fixing the cutting blade 30 to the flange mechanism 24. The cutting edge 32 includes abrasive grains of diamond, Cubic Boron Nitride (CBN) or the like and a metallic, resin or other bond material (binder), and is formed in a predetermined thickness. The cutting edge 32 is fixed to an outer peripheral edge of a one-side outer surface 312, which is a flat surface on one side, of the base 31. In addition, in the present embodiment, the cutting blade 30 is held with suction by the flange mechanism 24 fixed to the tip of the spindle 21.

The flange mechanism 24 is for fixing the cutting blade 30 to the spindle 21. The flange mechanism 24 is fixed to the tip of the spindle 21. The flange mechanism 24 includes a cylindrical cylinder section 27 attached to the periphery of the tapered section 211 of the spindle 21, and a flange section 28 projecting radially outward from an outer peripheral surface of the cylinder section 27. The cylinder section 27 integrally includes an insertion section 271 for inserting the tapered section 211 therein, and a boss section 272 to be inserted in and passed through the mounting hole 311 of the base 31 of the cutting blade 30. The inside diameter of the insertion section 271 is gradually reduced in going toward the boss section 272, and an inner peripheral surface of the insertion section 271 makes close contact with a peripheral surface of the tapered section 211. The boss section 272 is smaller than the insertion section 271 in inside and outside diameters. The boss section 272 is provided on the inner periphery side with a stepped surface 273 having an inside diameter reduced in a stepped manner in approaching the insertion section 271.

The flange section 28 projects in the radial direction of the flange mechanism 24 from a part between the insertion section 271 and the boss section 272 of the cylinder section 27. Specifically, the flange section 28 is provided on a rear side of the boss section 272 as viewed from a tip of the boss section 272. The flange section 28 is formed at an outer peripheral edge thereof with a support section 281 projecting to the boss section 272, ranging over the whole circumference. A surface 282 of the support section 281 is formed to be flat along both the X direction and the Y direction, and is a support surface for supporting an other-side outer surface 313 which is the other-side surface of the base 31 of the cutting blade 30. The distance 300 (see FIG. 3) in an axial direction between a tip surface 274, which is the tip of the boss section 272, and the surface 282 of the support section 281 is not greater than or equal to the thickness 400 of the base 31 of the cutting blade 30. While the distance 300 is equal to the thickness 400 in the present embodiment, the distance 300 may be smaller than the thickness 400 in the present invention.

The flange mechanism 24 is fixed to the tip of the spindle 21, as depicted in FIG. 3, through a step in which the tapered section 211 of the spindle 21 is fitted into the insertion section 271 of the cylinder section 27 inserted in the support tube section 232 of the rotary joint 25 fixed to the spindle housing 22, and a bolt 292 passed through the inside of a washer 291 laid on the stepped surface 273 is put into screw engagement with the screw hole 212. The flange mechanism 24 holds the cutting blade 30, through a step in which the boss section 272 is inserted in the mounting hole 31 of the cutting blade 30, in the state of being fixed to the spindle 21, and the other-side outer surface 313 of the base 31 is laid on the surface 282 of the support section 281 of the flange section 28. In addition, since the distance 300 is not greater than or equal to the thickness 400, the tip surface 274 of the boss section 272 is on the same plane as the other-side outer surface 312 of the base 31 of the cutting blade 30 or is recessed relative to the other-side outer surface 312 of the base 31, so that the tip surface 274 does not protrude from the other-side outer surface 312 of the base 31.

In addition, the spindle unit 26 includes a suction holding mechanism 33 adapted to suction hole the cutting blade 30 by the flange mechanism 24. The suction holding mechanism 33 includes a flange-side suction passage 34, a joint-side suction passage 35, and a suction source 36. The flange-side suction passage 34 is provided in the flange mechanism 24, and includes a groove section 341 and through-holes 342. The groove section 341 is formed in the form of a recess from the outer peripheral surface of the insertion section 271, and is provided ranging over the whole circumference of the outer peripheral surface of the insertion section 271. The through-holes 342 penetrate the flange mechanism 24, ranging between a one-side surface 283 of the flange section 28 that faces the base 31 of the cutting blade 30 and a bottom of the groove section 341. In other words, one end of the flange-side suction passage 34 opens to the inside of the support section 281 of the one-side surface 283 of the flange section 28 of the flange mechanism 24 that faces the other-side outer surface 313 of the base 31 of the cutting blade 30, and the other end of the flange-side suction passage 34 opens in the outer peripheral surface of the insertion section 271 of the cylinder section 27 inserted in the support tube section 232 of the rotary joint 25. The through-holes 342 are provided at regular intervals along the circumferential direction of the flange mechanism 24, and, in the present embodiment, three such through-holes 342 are provided.

The joint-side suction passage 35 is provided in the rotary joint 25, and includes a suction groove 351 and a connection pipe section 352. The suction groove 351 is formed in the form of a recess from an inner peripheral surface of the support tube section 232 of the rotary joint 25, and is provided ranging over the whole circumference of the inner peripheral surface of the support tube section 232. The suction groove 351 is provided at such a position as to face the groove section 341 of the flange-side suction passage 34.

The connection pipe section 352 is continuous with the outer peripheral surface of the support tube section 232 of the rotary joint 25, and communicates with the suction groove 351. The connection pipe section 352 is connected to the suction source 36. The joint-side suction passage 35 communicates with the flange-side suction passage 34, since the suction groove 351 is provided at such a position as to face the groove section 341 provided in the outer peripheral surface of the insertion section 271 of the flange-side suction passage 34. The suction source 36 is composed of a known vacuum pump or the like, and sucks the inside of the joint-side suction passage 35 and the flange-side suction passage 34. In other words, the joint-side suction passage 35 connects the inner periphery side of the support tube section 232 and the suction source 36.

In the suction holding mechanism 33, the suction source 36 sucks the inside of the joint-side suction passage 35 and the flange-side suction passage 34, whereby a negative pressure is generated in a space on the inner side of the support section 281 of the flange section 28 of the flange mechanism 24 and on the one-side surface 283 (referred to also as a space surrounded by the support section 281 and the one-side surface 283), and the other-side outer surface 313 of the base 31 of the cutting blade 30 held on the surface 282 of the support section 281 is sucked. The suction holding mechanism 33 sucks the other-side outer surface 313 of the base 31, and holds the cutting blade 30 onto the flange mechanism 24 with suction such that the cutting blade 30 is rotated as one body with the flange mechanism 24 by the spindle 21. In other words, the rotary joint 25 and the flange mechanism 24 are rotated relative to each other when the spindle 21 rotates the cutting blade 30.

The blade cover 37 is fixed to the spindle housing 22, and covers at least one side of the upper side and the X direction of the cutting blade 30, for supplying cutting water (which is a processing fluid) to the cutting blade 30 and the workpiece 201 during cutting. In the present embodiment, the blade cover 37 covers the cassette 60 side of the cutting blade 30 in regard of the X direction. In addition, an outer surface 373 of the blade cover 37 that faces the other cutting unit 20 is located on the same plane or substantially on the same plane as the surface of the cutting edge 32 of the cutting blade 30, whereby the projection amount of the blade cover 37 from the cutting blade 30 on the viewer's side in regard of the Y-axis direction of FIG. 2 is minimized.

The blade cover 37 is provided with a negative pressure supply pipe 371 which is provided between the connection pipe section 352 and the suction source 36 and which connects the connection pipe section 352 and the suction source 36, and a cutting water supply pipe 372 supplied with the cutting water from a cutting water supply source (not depicted). In addition, a blade-side nozzle member 38 and a workpiece-side nozzle member 39 are attached to the blade cover 37.

The blade-side nozzle member 38 and the workpiece-side nozzle member 39 are formed in a flat plate shape, and are laid on the outer surface of the blade cover 37. In the present embodiment, one blade-side nozzle member 38 is provided at such a position on the outer surface 373 of the blade cover 37 as to face the other cutting unit 20, and one workpiece-side nozzle member 39 is provided at such a position on the outer surface of the blade cover 37 as to be nearer to the cassette 60 than to the cutting blade 30. In the present invention, however, the positions and the numbers of the nozzle members 38 and 39 are not limited to the above-mentioned, and may be changed as required.

The blade-side nozzle member 38 defines, between itself and the blade cover 37, a blade-side jet port 381 which faces the edge tip of the cutting edge 32 of the cutting blade 30. The blade-side jet port 381 communicates with the cutting water supply pipe 372 through a hole provided in the blade cover 37 and the like, and supplies the cutting water, which is supplied from the cutting water supply source, toward the edge tip of the cutting edge 32 of the cutting blade 30.

The workpiece-side nozzle member 39 defines, between itself and the blade cover 37, a workpiece-side jet port 391 which faces the workpiece 201 to be cut by the cutting blade 30. The workpiece-side jet port 391 communicates with the cutting water supply pipe 372 through a hole provided in the blade cover 37 and the like, and supplies the cutting water, which is supplied from the cutting water supply source, toward the workpiece 201.

In addition, the cutting unit 20 is fixed to a cutting-in feeding table 54 which supports the spindle housing 22 such that an imaging unit 80 for imaging the front surface 202 of the workpiece 201 is moved as one body therewith. The imaging unit 80 includes a Charge Coupled Device (CCD) camera for imaging a region to be divided of the workpiece 201 yet to be cut, which is held by the chuck table 10. The CCD camera images the workpiece 201 held by the chuck table 10, to obtain an image for performing alignment between the workpiece 201 and the cutting blade 30, and outputs the thus obtained image to the control unit 100.

The control unit 100 controls the above-mentioned components of the cutting apparatus 1, for causing the cutting apparatus 1 to perform a processing operation for the workpiece 201. Note that the control unit 100 is a computer. The control unit 100 includes an arithmetic processing apparatus having a microprocessor such as a central processing unit (CPU), a storage apparatus having a memory such as a read only memory (ROM) or a random access memory (RAM), and an input/output interface apparatus. The arithmetic processing apparatus of the control unit 100 executes arithmetic processing according to a computer program stored in the storage apparatus, and outputs control signals for controlling the cutting apparatus 1 to the above-mentioned components of the cutting apparatus 1 through the input/output interface apparatus. In addition, the control unit 100 is connected to a display unit (not depicted) composed of a liquid crystal display or the like for displaying the state of the processing operation and an image and the like, and an input unit (not depicted) to be used when an operator registers information on the contents of processing. The input unit is composed of at least one of a touch panel provided on the display unit, and an external input apparatus such as a keyboard.

The cutting apparatus 1 configured as above starts the processing operation when the operator has registered the information on the contents of processing in the control unit 10, the operator has placed the cassette 60 accommodating the workpieces 201 yet to be cut on the cassette elevator 61, and an instruction to start the processing operation is given from the operator. Upon starting the processing operation, the cutting apparatus 1 causes the carrying unit to take out the workpiece 201 yet to be cut from the cassette 60, causes a back surface 205 side of the workpiece 201 to be held with suction by the holding surface 11 of the chuck table 10 through the adhesive tape 206, and causes the annular frame 207 to be clamped by the clamp sections 12.

The cutting apparatus 1 causes the processing feeding unit 51 to move the chuck table 10 toward a position under the cutting unit 20, causes the imaging unit 80 to image the workpiece 201, and performs alignment, based on the image picked up by the imaging unit 80. The cutting apparatus 1 moves the workpiece 201 and the cutting unit 20 relative to each other along the division line 203, causes the cutting blade 30 to cut in to each division line 203, to thereby divide the workpiece 201 into individual devices 204, cleans the workpiece 201 divided into the individual devices 204 by the cleaning unit 70, and accommodates the cleaned workpiece 201 into the cassette 60.

Figure 5:
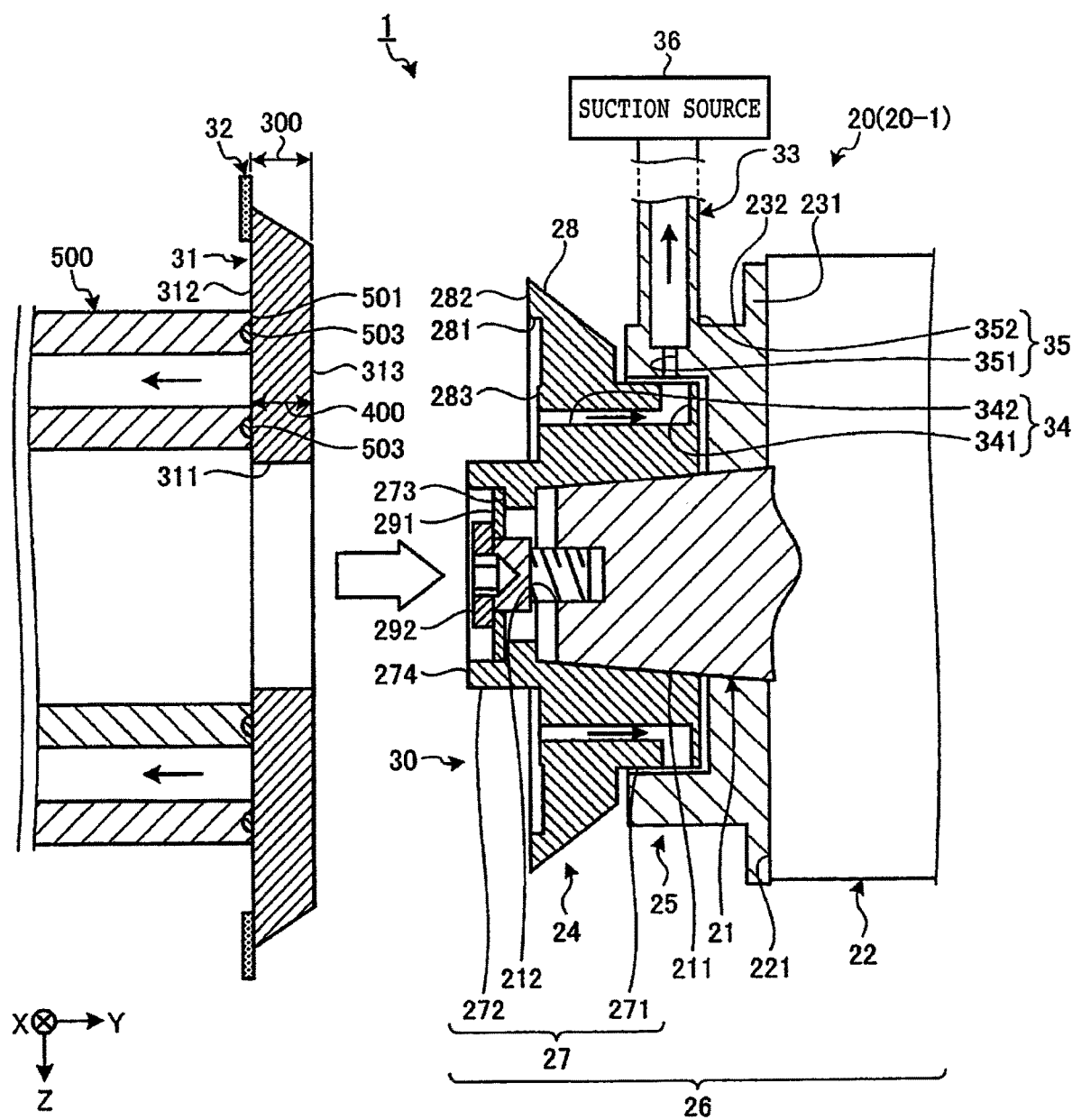
FIG. 5 is a sectional view depicting a state in which a suction holding mechanism of the cutting unit of the cutting apparatus according to the present embodiment is operated.
Figure 6:
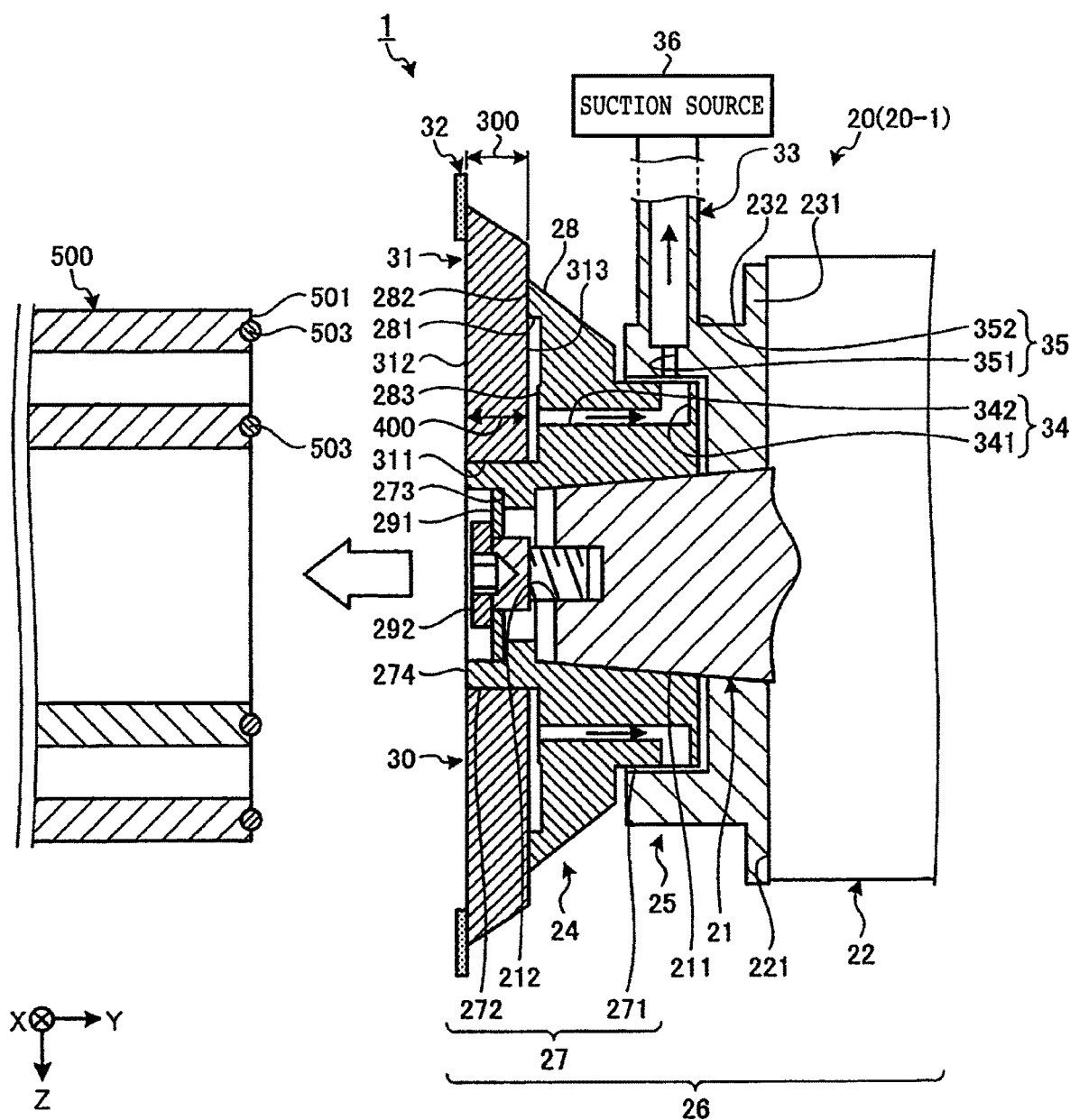
FIG. 6 is a sectional view depicting a state in which a cutting blade is mounted to the cutting unit illustrated in FIG. 5.
Figure 7:
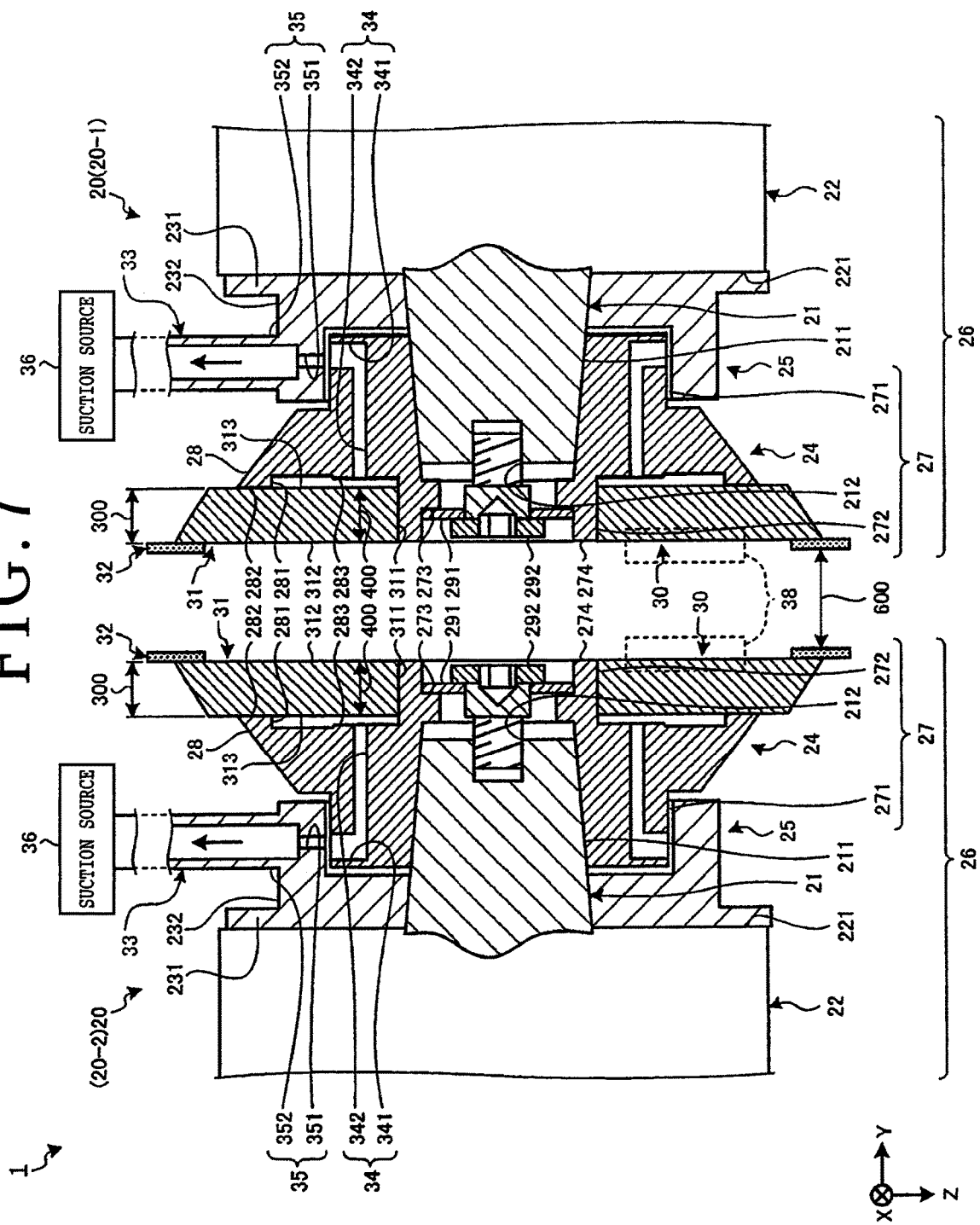
FIG. 7 is a sectional view depicting a state in which one-side outer surfaces of bases of the cutting bases mounted as depicted in FIG. 6 face each other.

A method of mounting the cutting blade 30 to the cutting unit 20 of the cutting apparatus 1 according to the present embodiment will be described below, based on the drawings. FIG. 5 is a sectional view depicting a state in which the suction holding mechanism of the cutting unit of the cutting apparatus according to the present embodiment is operated. FIG. 6 is a sectional view depicting a state in which the cutting blade is mounted to the cutting unit illustrated in FIG. 5. FIG. 7 is a sectional view depicting a state in which one-side outer surfaces of the bases of the cutting blades mounted as depicted in FIG. 6 face each other.

At the time of mounting the cutting blade 30 to the spindle 21 of the cutting unit 20, the control unit 100 stops the suction source 36 of the suction holding mechanism 33, in a state in which the rotation of the spindle 21 is stopped, as illustrated in FIG. 5. Then, the operator causes the other-side outer surface 313 of the base 31 of the cutting blade 30 held by a blade holding jig 500 to face the one-side surface 283 of the flange section 28 of the flange mechanism 24.

Note that while the blade holding jig 500 used in the present embodiment is for suction holding the one-side outer surface 312 of the base 31 of the cutting blade 30 by a negative pressure, the blade holding jig in the present invention is not limited to the one depicted in FIG. 5. Note that the blade holding jig 500 depicted in FIG. 5 has a seal member 503 which is formed from a rubber or the like and restrains the negative pressure from leaking, at a tip surface 501 for suction holding the one-side outer surface 312 of the base 31 of the cutting blade 30.

The operator inserts the boss section 272 of the flange mechanism 24 into the mounting hole 311, and lays the other-side outer surface 313 of the base 31 on the one-side surface 283 of the support section 281 of the flange section 28 of the flange mechanism 24. Then, the suction source 36 is operated, and the suction holding mechanism 33 holds the other-side outer surface 313 of the base 31 of the cutting blade 31 onto the flange section 28 of the flange mechanism 24 with suction by the negative pressure from the suction source 36, as illustrated in FIG. 6. Next, the negative pressure of the blade holding jig 500 is stopped, and the operator detaches the blade holding jig 500 from the base 31 of the cutting blade 30.

In this way, the flange mechanism 24 holds the other-side outer surface 313 side of the base 31 of the cutting blade 30 with suction by the negative pressure from the suction source 36 of the suction holding mechanism 33, and fixes the cutting blade 30 to the spindle 21 in a state in which the whole part of the one-side outer surface 312 of the base 31 is exposed on the tip side of the spindle 21. Then, of the respective cutting blades 30 fixed to the one-side cutting unit 20-1 and the other-side cutting unit 20-2, the one-side outer surfaces 312 of the bases 31 with the cutting edges 32 fixed to the outer peripheral edges thereof can face each other, as depicted in FIG. 7.

As has been described above, the cutting apparatus 1 according to the present embodiment, the cutting blade 30 is fixed, in a state in which the other-side outer surface 313 of the cutting blade 30 to which the cutting edge 32 is not attached is sucked onto the flange mechanism 24 and in which the one-side outer surface 312 side of the cutting blade 30 is exposed on the tip side. Therefore, in the cutting apparatus 1 according to the present embodiment, it is unnecessary to dispose a member for fixing the cutting blade 30 on the one-side outer surface 312 of the base 31, and the cutting edge 32 of the cutting blade 30 is set on the one-side outer surface 312 which is on the tip side of the spindle 21. As a result, in the cutting apparatus 1 according to the present embodiment, the distance 600 (depicted in FIG. 7) between the cutting blades 30 of the two cutting units 20 can be reduced.

In addition, since the cutting apparatus 1 includes the suction holding mechanism 33 for suction holding the cutting blade 30 onto the flange mechanism 24 by the negative pressure from the suction source 36, the cutting blade 30 can be fixed to the tip of the spindle 21 without disposing a fastening member such as a nut on the one-side outer surface 312. As a result, in the cutting apparatus 1, the distance 600 between the cutting blades 30 of the two cutting units 20 can be reduced to the utmost limit.

Besides, in the cutting apparatus 1, the stepped surface 273 is provided on the inside of the boss section 272 of the flange mechanism 24, and the bolt 292 passed through the washer 291 laid on the stepped surface 273 is put into screw engagement with the screw hole 212, whereby the flange mechanism 24 is fixed to the spindle 21. In addition, in the cutting apparatus 1, the distance 300 between the tip surface 274 of the boss section 272 of the flange mechanism 24 and the surface 282 of the support section 281 is not greater than or equal to the thickness 400 of the base 31 of the cutting blade 30. As a result, in the cutting apparatus 1, when the cutting blade 30 is mounted to the spindle 21, the flange mechanism 24 or the like does not protrude from the one-side outer surface 312 of the base 31. Consequently, in the cutting apparatus 1, the distance 600 between the cutting blades 30 of the two cutting units 20 can be reduced to the utmost limit.

Besides, in the cutting apparatus 1, the cutting water is supplied to the edge tip of the cutting edge 32 of the cutting blade 30 from the blade-side jet port 381 provided between the blade-side nozzle member 38 laid on the blade cover 37 and the blade cover 37. Therefore, in the cutting apparatus 1, the distance 600 between the cutting blades 30 of the two cutting units 20 can be reduced to the thickness corresponding to the two sheets of the blade-side nozzle members 38.

In addition, in the cutting apparatus 1, the suction holding mechanism 33 includes the flange-side suction passage 34 provided in the flange mechanism 24, and the joint-side suction passage 35 communicating with the flange-side suction passage 34. For this reason, in the suction holding mechanism 33, the negative pressure can be transmitted between the flange mechanism 24 and the rotary joint 25 which are rotated relative to each other, and the cutting blade 30 can be held with suction onto the flange mechanism 24.

Besides, in the cutting apparatus 1, one end of the flange-side suction passage 34 opens to the inside of the support section 281 of the one-side surface 283 of the flange section 28 of the flange mechanism 24 that faces the other-side outer surface 313 of the base 31 of the cutting blade 30, and the other end of the flange-side suction passage 34 opens in the outer peripheral surface of the insertion section 271 of the cylinder section 27 inserted in the support tube section 232 of the rotary joint 25. The joint-side suction passage 35 connects the inner periphery side of the support tube section 232 and the suction source 36. The suction holding mechanism 33 generates a negative pressure in the space which is on the inner side of the support section 281 of the flange section 28 of the flange mechanism 24 and which is on the one-side surface 283 (also referred to as the space surrounded by the support section 281 and the one-side surface 283). For this reason, it is unnecessary to provide the spindle 21 with a passage for transmitting the negative pressure of the suction source 36, and, therefore, it is unnecessary to attach a passage-closing member on the tip surface of the spindle 21. As a result, in the cutting apparatus 1, the cutting blade 30 can be fixed to the spindle 21 in a state in which the one-side outer surface 312 side of the base 31 is exposed on the tip side.

Note that the present invention is not limited to the above-described embodiment. The present invention can be carried out with various modifications without departing from the gist of the invention. For example, the cutting apparatus in the present invention may be provided with a determination mechanism by which it is determined that mounting is not perfect, for example, the cutting blade 30 is mounted in an inclined state, or that the suction holding is instable, in the case where the negative pressure does not reach a preset threshold, by measuring the negative pressure in the suction holding mechanism 33.

The present invention is not limited to the details of the above described preferred embodiment. The scope of the invention is defined by the appended claim and all changes and modifications as fall within the equivalence of the scope of the claims are therefore to be embraced by the invention.

What is claimed is:

1. A cutting apparatus comprising:
   a chuck table adapted to hold a workpiece, wherein the chuck table is configured to move in an X direction;
   a first cutting unit including: a first spindle having a rotational axis extending in a Y direction orthogonal to the X direction; a first spindle housing adapted to accommodate the first spindle in a rotatable manner; a first rotary joint fixed to a tip portion of the first spindle housing and having a first suction passage selectively connected to a suction source; a first flange mechanism mounted to a tip portion of the first spindle, the first flange mechanism provided with a first boss section and a first flange section projecting radially outward on a rear side of the first boss section and formed integrally with the first boss section and a first cylinder section formed integrally with the first flange section on a rear side of the first flange section, the first flange mechanism having a first annular suction groove formed at an outer periphery of the first cylinder section and communicating with the first suction passage, and a second suction passage having one end communicating with the first annular suction groove and the other end opening at a front surface of the first flange section; and a first cutting blade including an annular first base which has a first mounting hole formed in a center thereof and a one-side surface and an other-side surface opposite to the one-side surface, and a first cutting edge secured to an outer peripheral edge of the one-side surface of the annular first base, the first cutting blade mounted to the first flange mechanism by fitting the first mounting hole to the first boss section of the first flange mechanism; and
   a second cutting unit including: a second spindle having a rotational axis extending in the Y direction orthogonal to the X direction; a second spindle housing adapted to accommodate the second spindle in a rotatable manner; a second rotary joint fixed to a tip portion of the second spindle and having a third suction passage selectively connected to the suction source; a second flange mechanism mounted to a tip portion of the second spindle, the second flange mechanism provided with a second boss section and a second flange section projecting radially outward on a rear side of the second boss section and formed integrally with the second boss section and a second cylinder section formed integrally with the second flange section on a rear side of the second flange section, the second flange mechanism having a second annular suction groove formed at an outer periphery of the second cylinder section and communicating with the third suction passage of the second rotary joint, and a fourth suction passage having one end communicating with the second annular suction groove and the other end opening at a front surface of the second flange section; and a second cutting blade including an annular second base having a second mounting hole formed in a center thereof and a one-side surface and an other-side surface opposite to the one-side surface, and a second cutting edge secured to an outer peripheral edge of the one-side surface of the annular second base, the second cutting blade mounted to the second flange mechanism by fitting the second mounting hole to the second boss section of the second flange mechanism, wherein the first and second cutting blades have their other-side surface sides put into contact with and held with suction on the first and second flange sections of the first and second flange mechanisms by introduction of a negative pressure into the first and second flange mechanisms through the first and second rotary joints, and the first cutting blade mounted to the first spindle and the second cutting blade mounted to the second spindle are in a state in which the first cutting edge secured to the one-side surface of the annular first base and the second cutting edge secured to the one-side surface of the annular second base face each other, and wherein the first flange section comprises a support section that projects toward the boss section, the support section having an annular support surface that directly contacts the other-side surface of the annular first base.

2. The cutting apparatus according to claim 1, wherein the first boss section is smaller than the first cylinder section in inside diameter and outside diameter.

3. The cutting apparatus according to claim 1, wherein the first boss section comprises an inner periphery side with an inner stepped surface.

4. The cutting apparatus according to claim 1, wherein the first suction passage of the first rotary joint comprises a third annular suction groove, and wherein the third suction passage of the second rotary joint comprises a fourth annular suction groove.

* * * * *